United States Patent
Chu et al.

(10) Patent No.: US 6,819,563 B1
(45) Date of Patent: Nov. 16, 2004

(54) METHOD AND SYSTEM FOR COOLING ELECTRONICS RACKS USING PRE-COOLED AIR

(75) Inventors: Richard C. Chu, Hopewell Junction, NY (US); Michael J. Ellsworth, Jr., Lagrangeville, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/612,355

(22) Filed: Jul. 2, 2003

(51) Int. Cl.[7] .................................................. H05K 7/20
(52) U.S. Cl. ...................... 361/696; 361/690; 361/694; 361/695; 165/80.3; 165/104.33; 174/16.1; 454/184
(58) Field of Search ................................. 361/687–699, 361/715–716, 719–721; 174/15.1, 16.1; 165/80.4, 104.33, 122; 62/259.2

(56) References Cited

U.S. PATENT DOCUMENTS

| | | | |
|---|---|---|---|
| 5,467,250 A | * 11/1995 | Howard et al. | ............. 361/696 |
| 5,706,668 A | 1/1998 | Hilpert | ...................... 69/259.2 |
| 6,039,111 A | 3/2000 | Kawaguchi et al. | ... 165/104.14 |
| 6,164,369 A | 12/2000 | Stoller | .................... 165/104.33 |
| 6,305,180 B1 | 10/2001 | Miller et al. | ............... 62/259.2 |
| 6,349,031 B1 | * 2/2002 | Lin et al. | .................... 361/685 |
| 6,374,627 B1 | * 4/2002 | Schumacher et al. | ....... 62/259.2 |
| 6,506,111 B2 | * 1/2003 | Sharp et al. | ................. 454/184 |
| 6,533,031 B1 | * 3/2003 | Garcia et al. | ................ 165/263 |
| 6,574,970 B2 | * 6/2003 | Spinazzola et al. | ............. 62/89 |
| 6,704,198 B2 | * 3/2004 | Replogle et al. | ............ 361/690 |

OTHER PUBLICATIONS

IBM Technical Disclosure Bulletin, vol. 27, No. 7A, Dec. 1984, pp. 3887–3888, "Sandwich Heat Sinks With Hybrid Cooling For High Power Electronic Component Packaging" by Chan et al.

Lytron– Standard Products—Heat Exchangers—600 Series, four pages, Website Article http://www.lytron.com/standard/he_600_perform.htm.

Liebert Rackcooler Brochure—A Cool Solution For x–treme Density Rack Enclosure Systems, 8 pages—http://www.liebert.com.

App. Ser. No. 10/303,284 Filed Nov. 25, 2002, by Chu et al, entitled "Method and Apparatus For Combined Air and Liquid Cooling of Stacked Electronics Components" (POU920020098US1).

* cited by examiner

*Primary Examiner*—Boris Chervinsky
(74) *Attorney, Agent, or Firm*—Andrew J. Wojnicki, Jr.

(57) ABSTRACT

Augmenting air cooling of electronics systems using a cooling fluid to cool air entering the electronics system, and to remove a portion of the heat dissipated by the electronics. A cooled electronics system includes a frame, electronics drawers, fans or air moving devices, and an inlet heat exchanger. A cooling fluid such as chilled water is supplied to the inlet heat exchanger, to cool incoming air below ambient temperature. Fans cause ambient air to enter the system, flow through the inlet heat exchanger, through electronic devices, and exit the system. An optional exhaust heat exchanger further transfers heat dissipated by electronic devices to the cooling fluid. Heat exchangers are pivotally mounted, providing drawer access. Segmented heat exchangers provide access to individual drawers. Heat exchangers are integrated into cover assemblies. Airflow guides such as louvers are provided at inlets and outlets. Cover assemblies provide a degree of acoustic and electromagnetic shielding.

25 Claims, 8 Drawing Sheets

METHOD AND SYSTEM FOR COOLING ELECTRONICS RACKS USING PRE-COOLED AIR

CROSS REFERENCE TO RELATED APPLICATIONS

This application contains subject matter which is related to the subject matter of the following application, which is assigned to the same assignee as this application and which is hereby incorporated herein by reference in its entirety:

"Method and Apparatus for Combined Air and Liquid Cooling of Stacked Electronics Components;" by Chu et al., U.S. patent application Ser. No. 10/303,284, filed Nov. 25, 2002.

FIELD OF THE INVENTION

The present invention relates in general to cooling electronic systems. In particular, the present invention relates to augmenting air cooling of electronic systems using a cooling fluid to cool air entering the electronics system, and to remove a portion of the heat produced by the electronics system.

BACKGROUND

As is known, the power dissipation of integrated circuit chips, and assemblies containing integrated circuit chips, continues to increase. Increased power dissipation is driven by factors such as increases in processor performance and clock speed, and increases in the number of devices per integrated circuit. Increases in circuit, module, and system power dissipation pose cooling challenges at each level of assembly. In particular, in air cooled systems having constant inlet air temperature, increased system level power dissipation results in increased airflow requirements, in order to maintain desired device temperatures.

Many server applications consist of frames or racks, into which a number of electronics drawers are inserted. Each drawer may contain, for example, one or more processors, memory, one or more nonvolatile storage devices (such as a hard disk drive or HDD), one or more power supplies, etc. Each drawer may be individually removable, providing access to the drawer components for repair and maintenance. Such systems may further include one or more fans or air moving devices in or on each drawer, for the purpose of drawing ambient air into the frame, over the drawer components, and exhausting heated air out of the frame and back into the surrounding environment. Many such server frames may be placed within a single room or data center, often in close proximity to one another to conserve floor space. In such an environment, each rack is typically open to airflow in the front and back, and enclosed on the sides. Racks may be placed in rows, having little or no separation between the side of one rack and the side of an adjacent rack, while cooling "aisles" are provided at the front and rear of each row of racks. Cooling aisles thus facilitate airflow through the air cooled electronics rack.

As previously noted, when an air cooled system is placed in an environment having a specified ambient air temperature, increases in system power dissipation require increased airflow to maintain a desired device temperature. Increased airflow may be accomplished through the use of more powerful air moving devices, or by increasing the rotational speed (RPM) of an existing air moving device. There are disadvantages and limitations to this approach, however.

As system level power dissipation increases, so does the total quantity of heat exhausted from the rack into the ambient. Assuming that desired chip temperatures can be maintained merely by increased airflow, increases in system level power dissipation place additional burdens upon customers' room air conditioning systems, by increasing the heat loads these systems must handle. The problem is exacerbated in server farms, or installations having many electronics racks in close proximity. Room air conditioning may therefore impose a practical limit on the total amount of heat removable from a set of electronics racks. Furthermore, as additional heat is exhausted into the ambient, neighboring racks may become increasingly susceptible to increased inlet air temperatures, due to increases in ambient temperature or to heated exhaust air from one rack "leaking" into the inlet of a neighboring rack.

Two additional disadvantages may be experienced when increased system level heat loads are cooled by simply increasing airflow. First, as previously noted, airflow may be increased through the use of a more powerful air moving device, or by increasing the rotational speed of an existing air moving device. In either case, the acoustic noise produced by the air moving devices is likely to increase. Increased noise levels may surpass acceptable acoustic limits, especially when many air moving devices are used in each rack system. Second, since each rack system provides air inlets and outlets in the front and back of each rack, respectively, traditional closed or solid system covers may not be utilized on the front and back of the rack system. The air inlet and outlet openings impair effective acoustic insulation and electromagnetic shielding of the rack systems.

For the foregoing reasons, therefore, there is a need in the art for an auxiliary cooling system for use with air cooled electronic rack systems.

SUMMARY

The shortcomings of the prior art are overcome, and additional advantages realized, through the provision of a system and method for air cooling electronics systems by using a water to air heat exchanger to cool air entering the system, and to further remove a portion of the heat produced by the electronics.

The invention includes, in one aspect, a frame having an air inlet and an air outlet, at least one electronics drawer within the frame, at least one air moving device within the frame, where the at least one air moving device is capable of causing air to flow from the air inlet, across the electronics drawer, and to the air outlet, and a heat exchanger located at the air inlet, where the heat exchanger is capable of cooling incoming air to a temperature below that of the ambient.

In another aspect, the invention includes a method of cooling an electronics system including causing air to enter the electronics system, providing a first heat exchanger to cool the incoming air to a temperature below ambient temperature, and causing air exiting the first heat exchanger to flow through the electronics system.

In an enhanced aspect, the present invention includes a frame having an air inlet and an air outlet, a plurality of electronics drawers within the frame, a plurality of air moving devices within the frame, where the air moving devices are capable of causing air to flow from the inlet, across the electronics drawers, and to the outlet, an inlet cover pivotally mounted to the frame at the air inlet, the inlet cover having louvers to direct incoming airflow, an inlet heat exchanger integrated into the inlet cover, where the inlet heat exchanger is capable of cooling air entering the frame below ambient temperature and is further capable of pivoting as a single unit along with the inlet cover, where the inlet cover, louvers, and inlet heat exchanger provide acoustic insulation and electromagnetic shielding.

It is therefore an object of the present invention to provide a system and method of air cooling electronics systems by using a liquid to air heat exchanger to cool incoming air to a temperature below ambient temperature.

It is a further object of the present invention to reduce the cooling burden placed on room air conditioning systems by transferring at least a portion of the heat dissipated by the electronics system to a cooling fluid.

It is a further object of the present invention to provide convenient access to electronics drawers within electronics systems, by providing movable heat exchangers.

It is yet another object of the present invention to provide cooled electronics systems that are easily introduced into typical data center environments.

The recitation herein of a list of desirable objects which are met by various embodiments of the present invention is not meant to imply or suggest that any or all of these objects are present as essential features, either individually or collectively, in the most general embodiment of the present invention or in any of its more specific embodiments.

Additional features and advantages are realized through the teachings of the present invention. Other embodiments, features, and aspects of the present invention are described in detail herein and are considered part of the claimed invention.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

In accordance with preferred embodiments of the present invention, an air cooled electronics rack system is disclosed, using an auxiliary inlet heat exchanger to lower the temperature of inlet air below the temperature of room ambient air.

Figure 1:
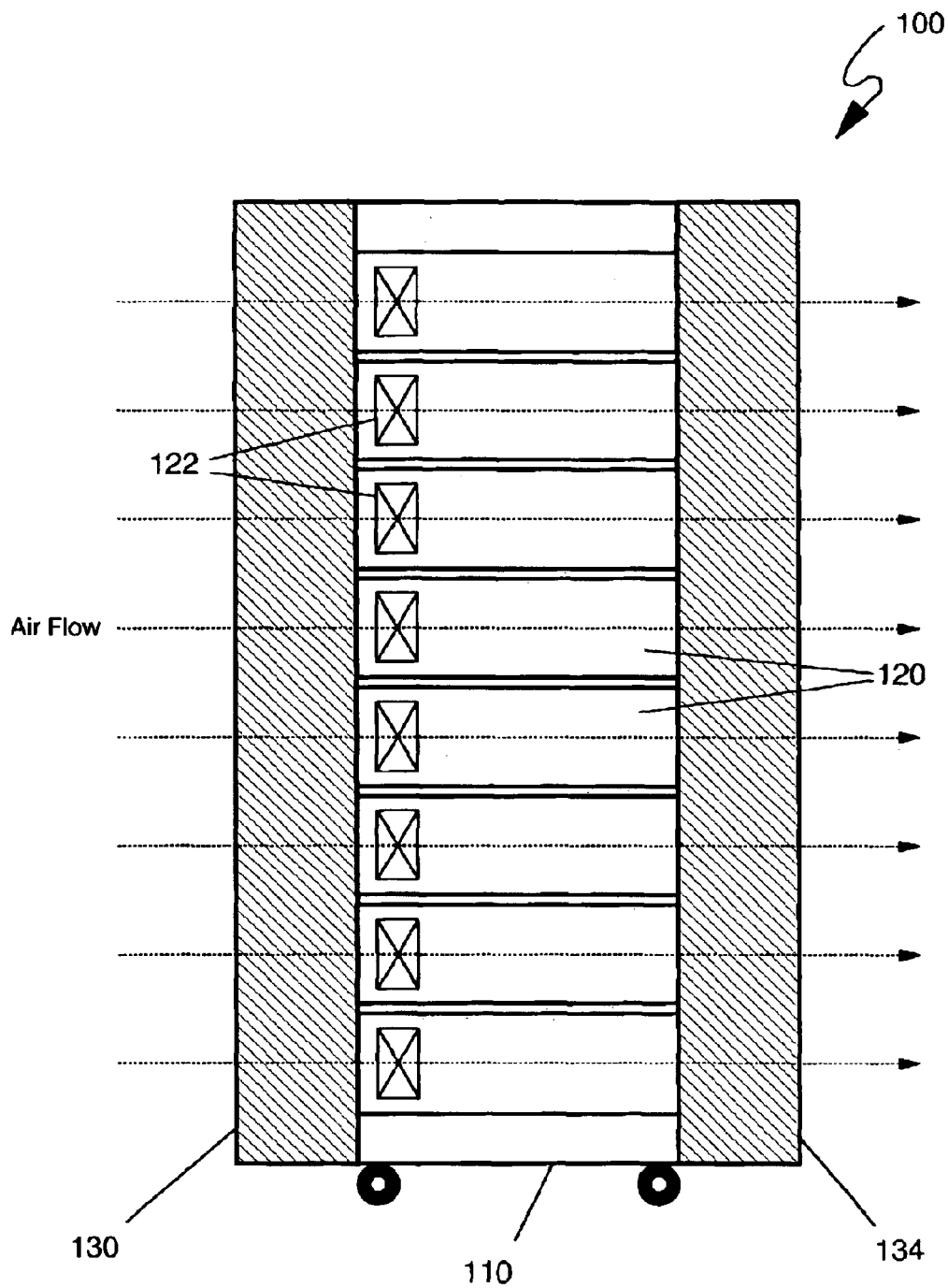
FIG. 1 illustrates a side view of an air cooled electronics rack system, as known in the art.

FIG. 1 illustrates an air cooled electronics rack system 100, as known in the art. System includes frame 110. Frame 110 provides mechanical support for one or more electronics drawers 120, front cover or panel 130, and rear cover or panel 134. System 100 further includes at least one air moving device, such as device 122. In systems having multiple drawers, one air moving device 122 may be associated with each electronics drawer 120. Each air moving device 122 may be physically attached to the electronics drawer with which it is associated. Alternatively, air moving devices may be physically attached to frame 110. Drawers 120 may be permanently mounted within frame 110, using fasteners such as bolts or clamps. Alternatively, drawers 120 may be slidably mounted within frame 110, providing easy access to the contents of drawer 120 for repair, maintenance, and upgrades.

As illustrated in FIG. 1, air moving devices 122 cause ambient air to enter system 100 through openings in front cover 130. Air then flows over or through drawers 120, where heat is transferred to the air from electronic devices within drawer 120, thereby increasing the temperature of the air is it passes over or through electronics drawer 120. Heated air then exits system 100 through openings in back cover 134, where it returns to and mixes with room ambient air. An external room air conditioning system (not shown) cools and circulates room ambient air, thereby removing from the ambient the heat removed from system 100.

Figure 2:
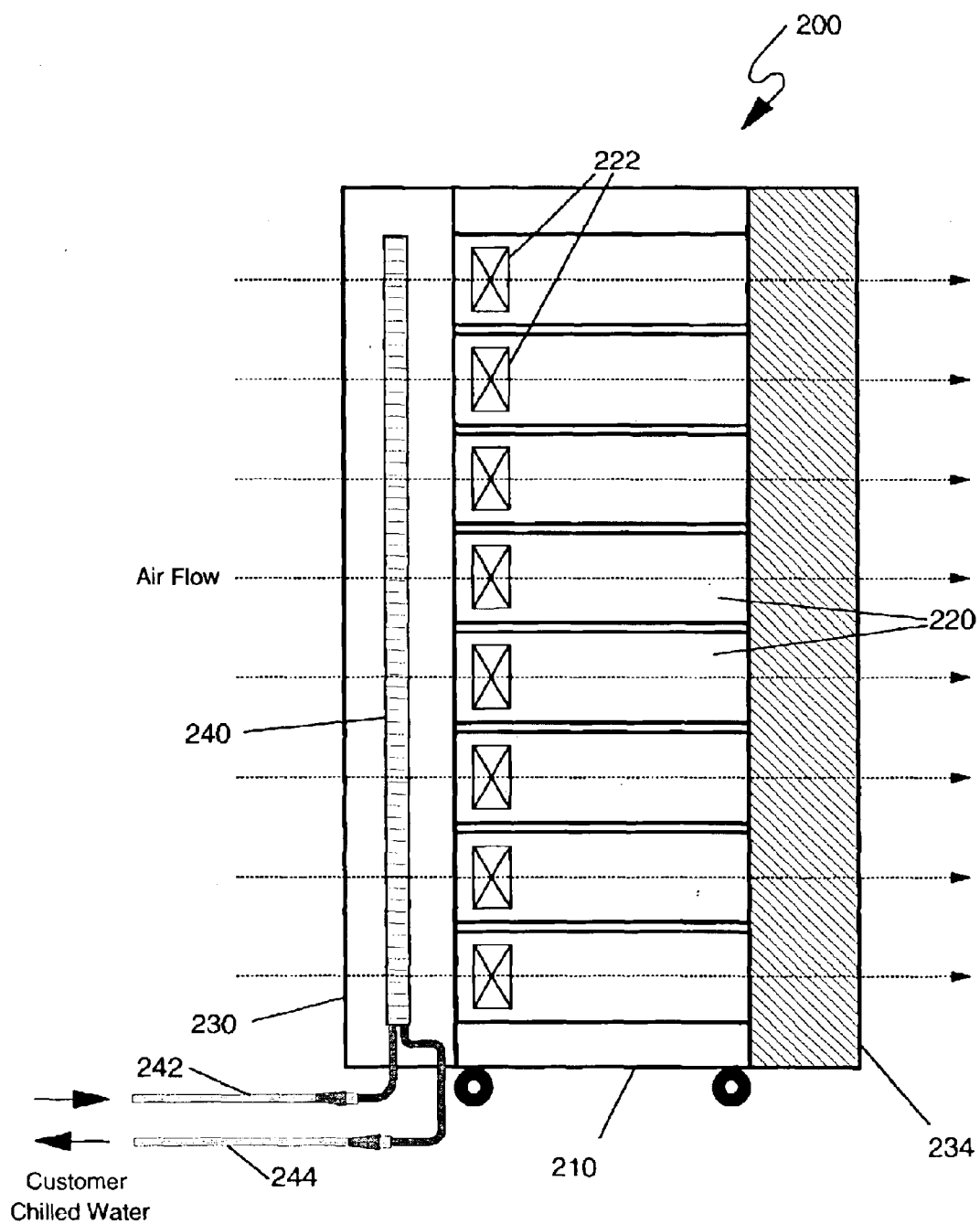
FIG. 2 illustrates a side view of an air cooled electronics rack system having an inlet heat exchanger, per an embodiment of the present invention.

FIG. 2 illustrates a cooled electronics system 200 per an embodiment of the present invention. As in system 100 of FIG. 1, system 200 includes frame 210, one or more electronics drawers 220, one or more air moving devices 222, and outlet cover 234. In addition to components analogous to those present in system 100, system 200 further includes an auxiliary heat removal system consisting of inlet heat exchanger 240. Inlet heat exchanger 240 may be provided in addition to a standard cover such as cover 130 of FIG. 1, however in preferred embodiments of the present invention inlet heat exchanger 240 is integrated into a cover 230 of the present invention. Inlet heat exchanger 240 is a water to air, tube and fin heat exchanger, as known in the art. In preferred embodiments of the present invention, inlet heat exchanger 240 consists of one or more fluid flow paths, formed of thermally conductive tubing such as copper or other tubing, in thermal and mechanical contact with a plurality of cooling fins. As illustrated in FIG. 2, heat exchanger 240 is in fluid communication with a source of cooled liquid, such as a chilled water supply, through inlet 242 and outlet 244. The liquid is cooled to a temperature below room ambient temperature. Chilled water (or other cooled fluid) enters heat exchanger 240 at fluid inlet 242, then flows serially in a serpentine path through heat exchanger 240, then exits heat exchanger 240 and returns, via outlet 244, to an external cooling system (not shown), such as a chiller. In alternative embodiments of the present invention, heat exchanger 240 provides a plurality of parallel fluid flow paths, connected by inlet and outlet plenums. Other fluid flow designs may be employed within heat exchanger 240, in keeping with the spirit and scope of the present invention.

As illustrated in FIG. 2, air moving device(s) 222 cause ambient air to enter through openings in cover 230, similar to system 100 of FIG. 1. Once inside cover 230, however, air is forced to flow through heat exchanger 240. As air flows across the fins of heat exchanger 240, heat is transferred to the cooling fluid circulating through heat exchanger 240. Since the liquid within heat exchanger 240 is at a temperature below room ambient temperature, air exiting heat exchanger 240 is therefore at a lower temperature than the ambient air entering heat exchanger 240. Air entering electronics drawers 220 is therefore at a lower temperature than the ambient air. By thus reducing the temperature of air entering drawers 220, it is possible to increase device power dissipation while maintaining a desired chip temperature, without increasing airflow.

The configuration of FIG. 2 provides a number of advantages over the prior art system illustrated in FIG. 1. As previously noted, the reduced temperature of air flowing through drawers 222 provides increased heat removal capability while maintaining both chip temperature and airflow rate. Also, by using a chilled water supply that is maintained at a sufficiently low temperature, the temperature of air entering drawers 220 can be maintained at or below an acceptable maximum temperature over a wider range of room ambient air temperatures, including room ambient temperatures exceeding the maximum allowable drawer inlet air temperature. In addition, heat exchanger 240 provides a slight reduction in the thermal burden placed upon the room air conditioning system, by transferring a portion of the heat from system 200 to the cooling fluid. Furthermore, heat exchanger 240 provides a degree of acoustic insulation and electromagnetic shielding beyond that provided in the prior art system of FIG. 1.

Heat exchanger 240 is capable of being sized as needed to meet the cooling needs of a specific rack system. In systems 200 fully populated with drawers 220, each drawer 220 containing electronic components having high power dissipation, heat exchanger 240 should be designed to extend from the lowest to the highest drawer, or substantially along the entire active height of frame 210. As used herein, the active height of frame 210 is the inner height of frame 210, wherein electronic drawers 220 and other active components are located. Alternatively, other system designs are envisioned which only partially populate system 200 with drawers 220 having high power dissipation: other portions of such a partially populated system 200 contain low power components coolable using room ambient air. In such systems, heat exchanger 240 should be designed to cover only the portion of system 200 having high power dissipation drawers 220, leaving the portion of system 200 having low power components open to room ambient air. In such a system, a shorter heat exchanger 240 is feasible, where heat exchanger 240 extends vertically over the portion of system 200 having high power dissipation drawers 220.

Figure 3:
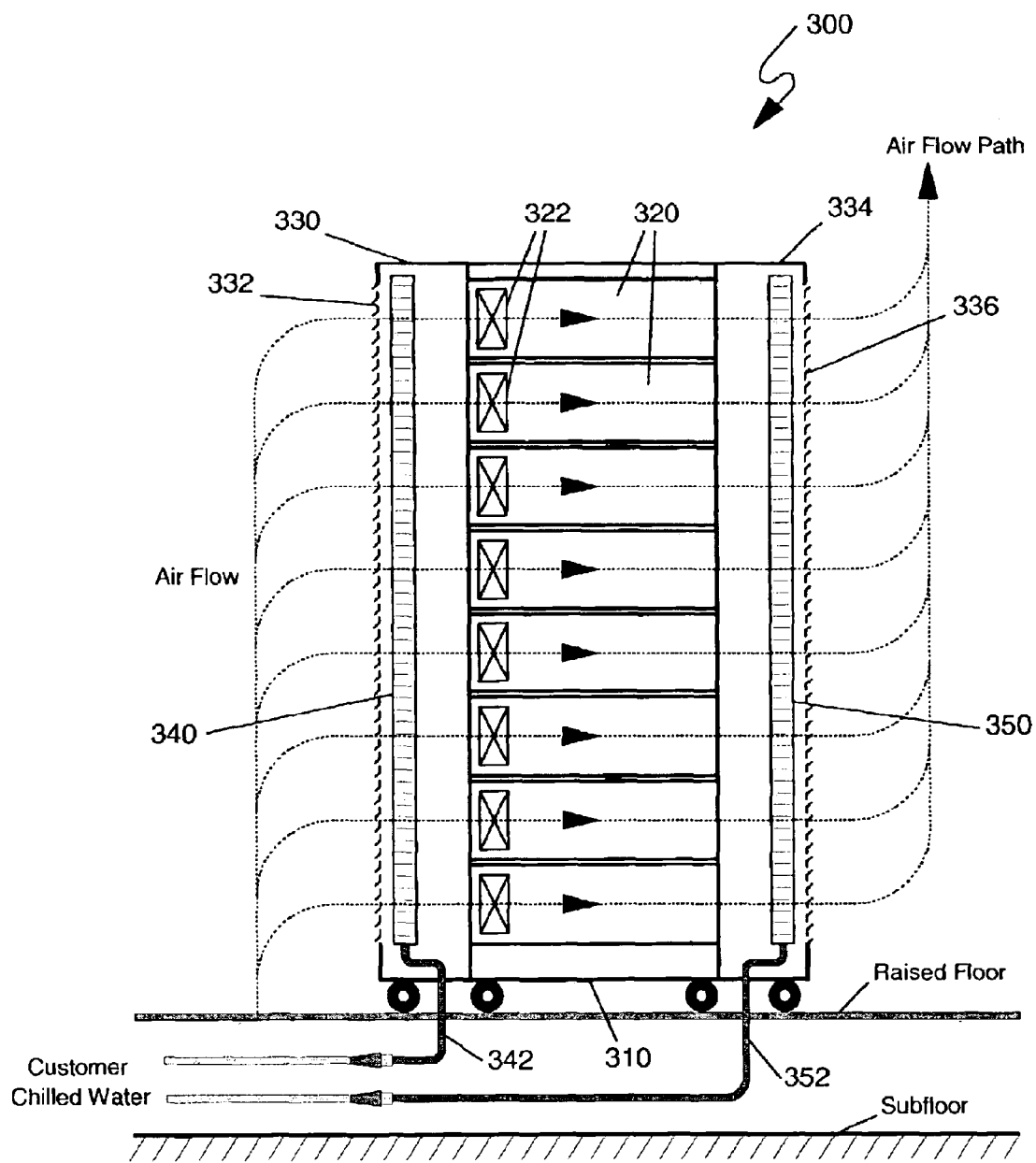
FIG. 3 illustrates a side view of an air cooled electronics rack system having an inlet heat exchanger and an outlet heat exchanger, per an embodiment of the present invention.

FIG. 3 illustrates another embodiment of the present invention, providing several advantages in addition to those provided in the embodiment of FIG. 2. As in system 200 of FIG. 2, system 300 includes frame 310, one or more electronics drawers 320, one or more air moving devices 322, an inlet heat exchanger 340, and inlet cover 330. Inlet heat exchanger 340 functions in the same manner as heat exchanger 240: a cooling fluid such as chilled water enters through inlet 342 and circulates through heat exchanger 340, air moving device(s) 322 cause ambient air to flow through openings in inlet cover 330 and through heat exchanger 340, where heat is transferred from the air to the cooling fluid, thereby lowering the temperature of air entering electronics drawers to below ambient temperature. Heated water then exits heat exchanger 340 through outlet 344 (shown in FIG. 4A), returning to an external chiller. In addition to inlet heat exchanger 340, system 300 further includes exhaust or outlet heat exchanger 350. As used herein with respect to airflow, the terms exhaust and outlet are synonymous. Exhaust heat exchanger 350 is an air to liquid heat exchanger as known in the art, similar to inlet heat exchanger 340, and preferably connected to the same supply of chilled cooling fluid through inlet 352 and outlet 354 (shown in FIG. 4A). Air flowing into device drawers 320 is cooled below room ambient temperature by inlet heat exchanger 340, however the air temperature rises as heat is transferred from electronic devices within drawer 320 to the air flowing through drawer 320. As a result, air exiting drawer 320 is most likely at a temperature above room ambient temperature. Heat exchanger 350 transfers some portion of the heat from the exhaust air to the cooling fluid: in preferred embodiments, heat exchanger 350 exhausts air at temperatures at or near room ambient temperature. Heat exchanger 350 therefore significantly reduces the thermal burden placed on the room air conditioning system.

FIG. 3 illustrates an additional feature of system 300, airflow baffles or louvers to direct airflow. As shown in FIG. 3, inlet louvers 332 are angled downward, while exhaust louvers 336 are angled upward. As previously discussed, in many data centers or server farms, electronic rack systems such as system 300 are arranged side by side with minimal space between systems, creating one or more rows of systems. Systems thus arranged are typically closed to airflow on both sides, and open to airflow at the front and rear. At the front and rear of each such row of systems is typically provided an airflow aisle, one aisle typically providing cool air ("cool" aisle) and one aisle typically receiving heated exhaust air ("hot" aisle). Systems are arranged within each row such that air inlets face toward the cool aisle while air exhausts face toward the hot aisle. Also, while not strictly required for thermal performance, air inlets are typically provided in the front portion of each system and air outlets provided in the back of each system: in this manner, each system front typically faces toward its "cool" aisle, thereby making operating and maintenance tasks more convenient. When implemented in a typical raised floor environment, hot aisle ducts are typically located at the ceiling while cold aisle ducts are typically located at floor level. Inlet louvers 332 are therefore directed downward, insuring that the coolest available air is drawn upwards from the floor ducts located in the cool aisle. Similarly, exhaust louvers 336 are directed upward, insuring that heated exhaust air is directed toward the ceiling ducts located in the hot aisle. In this manner, airflow through system 300 assists and is in concert with the ambient airflow pattern within a typical raised floor data center.

Additional advantages are realized in embodiments having louvered covers, such as the embodiment illustrated in FIG. 3. In particular, the combination of cooling fins within heat exchangers 340 and 350 and louvers 332 and 336 provides acoustic insulation and electromagnetic shielding superior to the embodiment illustrated in FIG. 2, having only a heat exchanger without louvers. Both the embodiment of FIG. 2 and the embodiment of FIG. 3 do, however, provide acoustic insulation and electromagnetic shielding that is superior to that provided by the prior art system of FIG. 1.

Figure 4A:
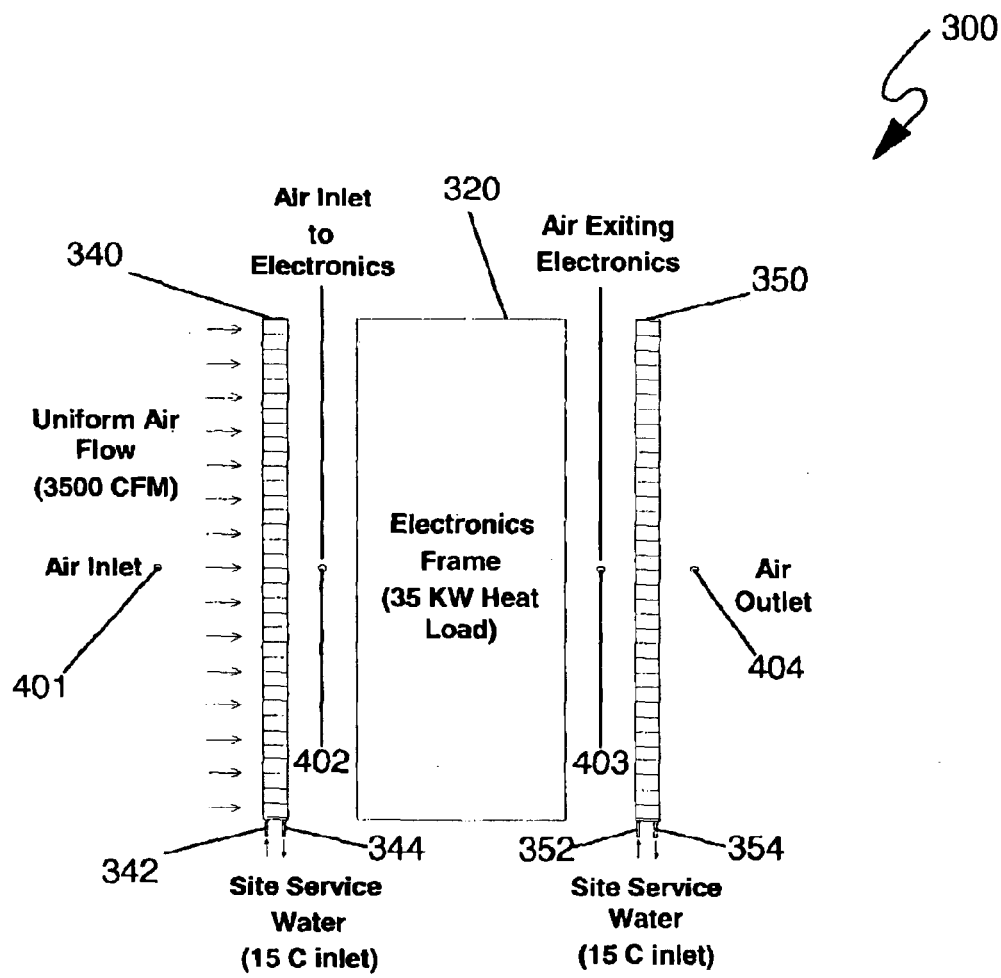
FIG. 4A depicts a schematic view of airflow through a system having inlet and outlet heat exchangers, per an embodiment of the present invention.
Figure 4B:
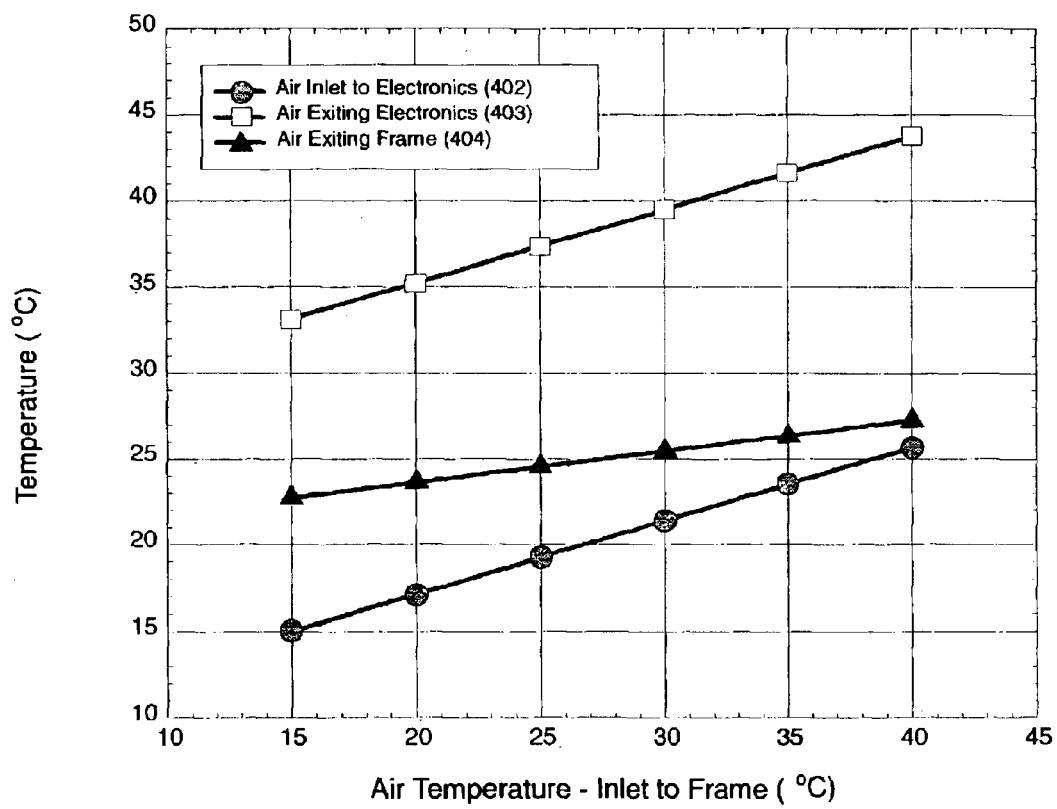
FIG. 4B depicts a graph of modeled thermal performance of the embodiment depicted in FIG. 4A.

FIGS. 4A and 4B illustrate the results of a sample modeling analysis, predicting the temperature at three points within the airflow path as a Function of the ambient air temperature. FIG. 4A depicts a top schematic view of a system such as system 300, having both inlet and exhaust heat exchangers 340 and 350, respectively, and one or more electronics drawers 320. FIG. 4B illustrates the predicted temperature relationship between four points along the airflow path of FIG. 4A: ambient at point 401, drawer inlet at point 402, drawer exhaust at point 403, and system exhaust at point 404. FIG. 4B depicts predicted temperatures at points 402, 403, and 404 as a function of ambient air temperature (point 401). The curves illustrated in FIG. 4B represent the following model design assumptions: heat exchanger dimensions 24 inches wide by 73.5 inches high by 3.5 inches deep; cooling fluid is 15° C. inlet temperature water, at 5 gallons per minute flow rate to each heat exchanger, at a pressure drop of less than 1 p.s.i.; uniform air flow of 3,500 cubic feet per minute (c.f.m.), at a pressure drop of 0.05 inches of water. Heat exchanger performance assumptions are based on published data. For example, in the sample modeling analysis depicted in FIG. 4, heat exchanger performance is based upon published data for a model 6340 copper heat exchanger manufactured by Lytron, Inc.

The assumptions used for the sample modeling analysis of FIG. 4 are merely exemplary, and in no way limit the scope of the present invention. Other heat exchanger designs, performance parameters, and other model or design assumptions may be used by those skilled in the art to fashion alternative system designs having air temperature relationships differing from those illustrated in FIG. 4B, within the spirit and scope of the present invention.

The benefits provided by each heat exchanger may be understood with reference to the exemplary temperature curves provided in FIG. 4B. For example, inlet heat exchanger 340 reduces the temperature of incoming air by as much as 15° C., insuring that the air entering electronics drawer 320 (at point 402) does not exceed 26° C. as long as the ambient temperature does not exceed 40° C. The primary benefit provided by inlet heat exchanger 340 is, therefore, reduced inlet air temperature, thereby maintaining acceptable air temperatures into drawers 320 even as the ambient air temperature approaches worst case maximum. Inlet heat exchanger 340 further provides an additional benefit, slightly increasing the overall cooling capability of system 300. The benefit provided by exhaust heat exchanger 350 is illustrated in FIG. 4B as the temperature difference between air exiting electronics drawer 320 (at point 403) and air exiting heat exchanger 350 (at point 404). In the modeling analysis depicted in FIG. 4, at nominal ambient air temperature (25° C.), exhaust heat exchanger 350 absorbs approximately 25KW of the 35KW of heat produced by the electronics within system 300, or about 71%. At the upper limit of ambient air temperature (40° C.), an even greater portion of the waste heat is handled by exhaust heat exchanger 350, at over 90%. Furthermore, these percentages may be further increased by reducing the chilled water inlet temperature below the 15° C. assumption used in this modeling analysis. As a result, while the temperature of air exiting electronics drawers 320 (point 403) exceeds ambient temperature by as much as about 18° C. in the modeling analysis of FIG. 4, the temperature of air exiting exhaust heat exchanger 350 (point 404) remains near ambient temperature.

Figure 5:
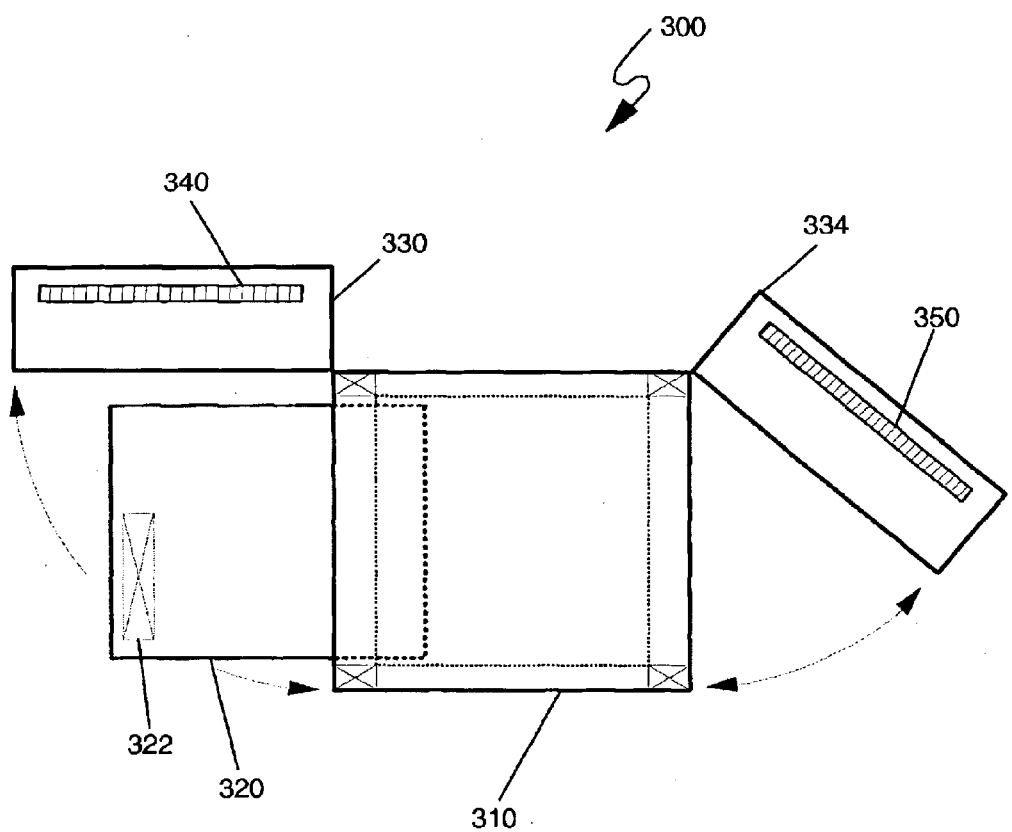
FIG. 5 depicts a top view of an electronics system having hinged front and rear panels including integrated heat exchangers, per an embodiment of the present invention.

FIG. 5 depicts a top view of system 300, illustrating how covers 330 and 334 are movable, providing access to drawers 320. In preferred embodiments of the present invention, heat exchangers 340 and 350 are integrated into covers 330 and 334, respectively. Covers 330 and 334 are pivotally mounted on frame 310, such as by using one or more hinges along a side of frame 310, as illustrated in FIG. 5. Heat exchangers 340 and 350 are connected to their respective inlets and outlets (342, 344, 352, 354) in a manner that allows heat exchangers 340 and 350 to move in concert with covers 330 and 334, respectively, while maintaining cooling fluid connections. For example, heat exchangers 340 and 350 are connected to their respective inlets and outlets using a length of flexible tubing. Alternative connections capable of pivoting while maintaining fluid connection may be used. FIG. 5 depicts inlet cover 330 in the fully open position, allowing drawer 320 to slide out of frame 310, providing access to electronic components within drawer 320. Exhaust cover 334 is illustrated in a partially open position, providing access to the rear portion of drawers 320. Other drawers 320 within frame 310 may continue to operate while covers 330 and 334 are in partially or fully open positions, however device temperatures may increase somewhat since heat exchangers 340 and 350 are no longer part of the airflow path. The effects are minimized by limiting the amount of time covers 330 and 334 are opened.

Figure 6A:
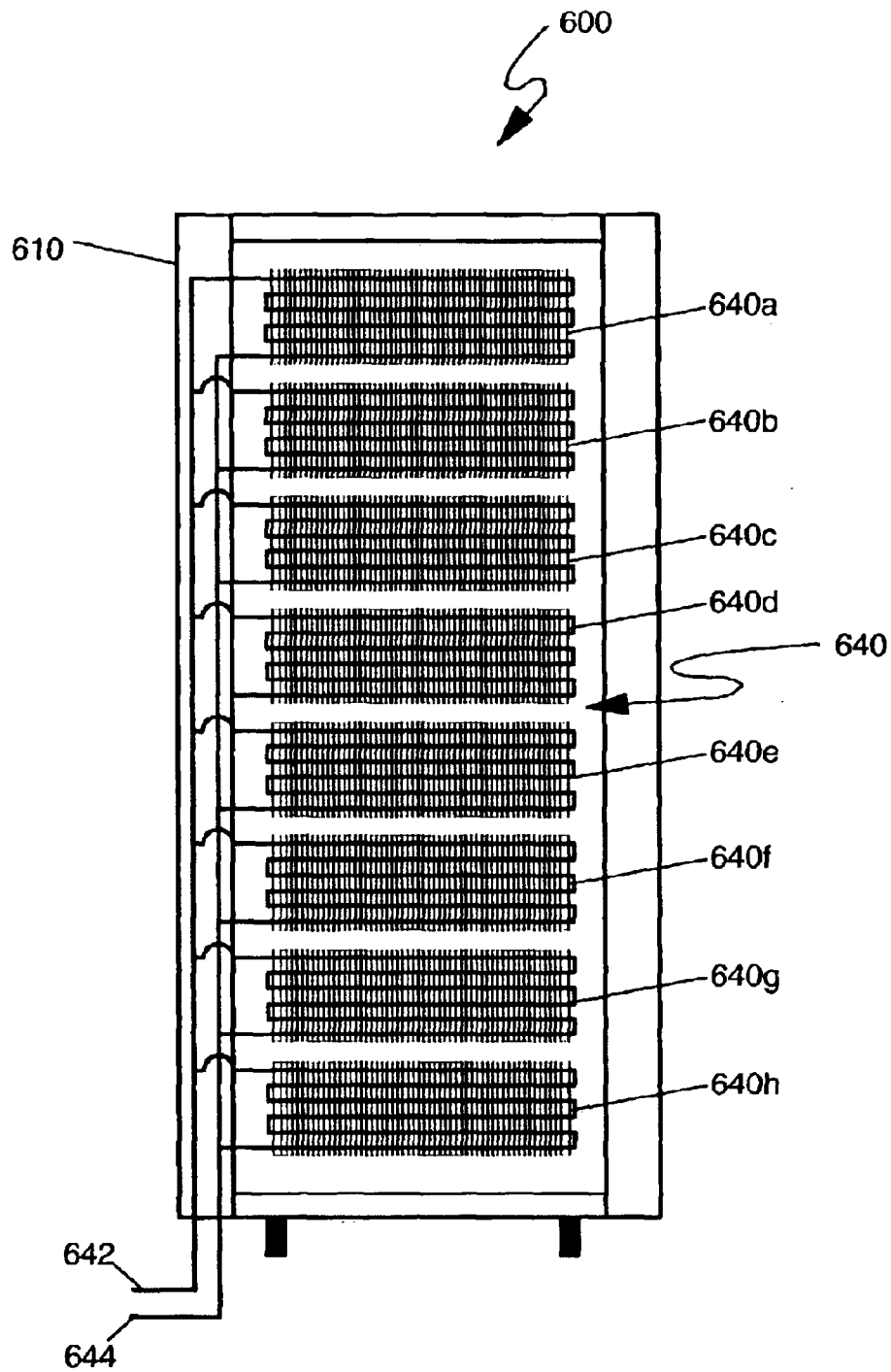
FIG. 6A depicts a front view of an electronics system having a segmented inlet heat exchanger, per an embodiment of the present invention.
Figure 6B:
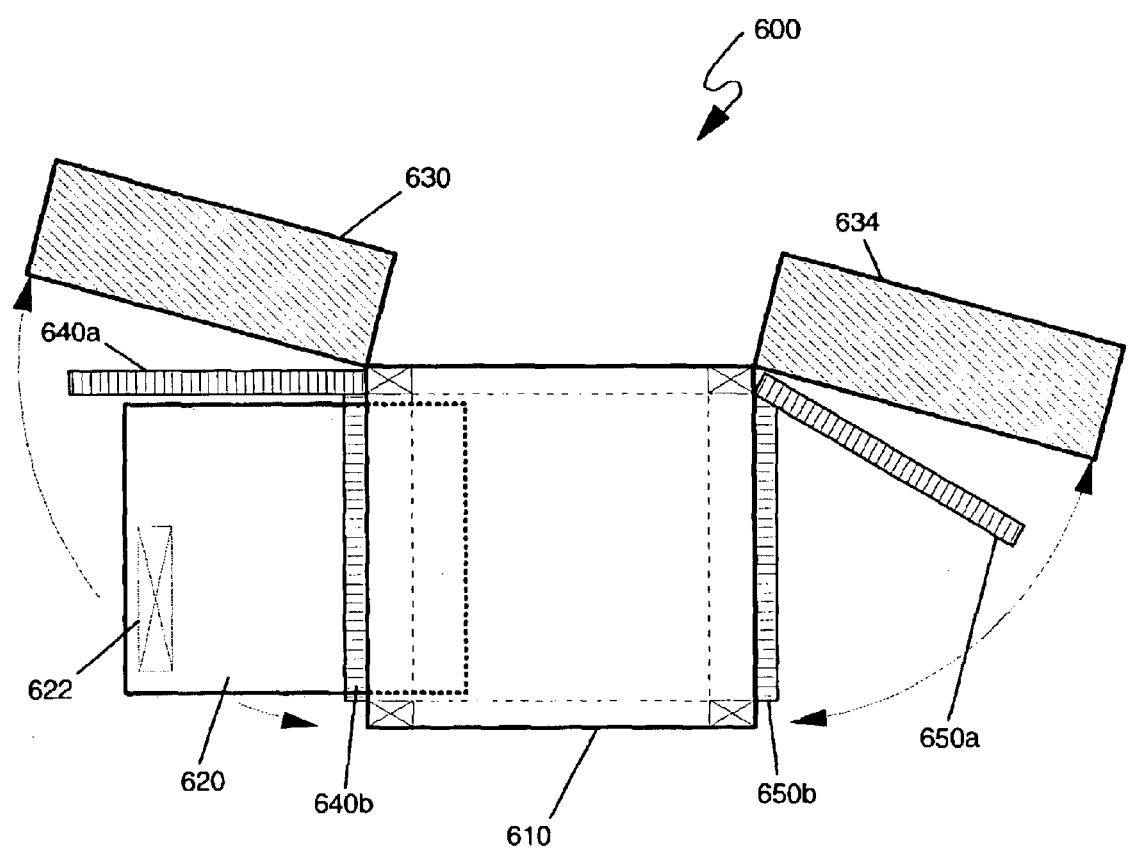
FIG. 6B depicts a top view of the embodiment of FIG. 6A, showing hinged front and rear panels and hinged heat exchanger segments.

FIGS. 6A and 6B depict a front view of yet another embodiment of the present invention, facilitating access to individual drawers without impacting cooling of other drawers. System 600 includes a segmented heat exchanger 640, where each segment is pivotally mounted on frame 610. The embodiment of FIG. 6 includes a heat exchanger 640 having eight segments, 640a through 640h: embodiments including more or fewer segments are envisioned within the spirit and scope of the present invention. Each of segments 640a through 640h is appropriately sized such that it extends vertically over a single electronics drawer 620 (visible in FIG. 6B). As illustrated in FIG. 6A, each segment of heat exchanger 640 includes a connection to chilled water inlet 642 and a connection to chilled water outlet 644. All segments are supplied in parallel by a single inlet tube and single outlet tube, as illustrated in FIG. 6A. Connections between the heat exchanger segments and inlet/outlet tubes are preferably formed in a manner that maintains fluid flow through each segment while permitting each segment to pivot to a fully open position (at least 90 degrees of rotation). These connections are formed using flexible tubing, or other connections capable of pivoting while maintaining fluid flow connection.

FIG. 6B depicts a top view of system 600 during maintenance of a single drawer 620. In the embodiment illustrated in FIG. 6B, a single inlet cover 630 is shown in a fully open position. Since a single cover 630 is utilized with a segmented heat exchanger 640 in this embodiment, cover 630 and heat exchanger segments 640a and 640b are capable of being pivoted independently of each other. In other words, cover 630 pivots into the fully open position without disturbing any segments of heat exchanger 640. Once cover 630 is opened, any segment of heat exchanger 640 may be pivoted into the open position independently of any other segment. In FIG. 6B, system 600 is shown having cover 630 open, and segment 640a of heat exchanger 640 pivoted into a fully open position. In this manner, drawer 620 is accessible, such as by sliding drawer 620 into a forward position as illustrated in FIG. 6B. Unlike a single-segment heat exchanger embodiment, as illustrated in FIGS. 2 and 3, heat exchanger segment 640b (and any segments other than 640a) remains in its fully active position, providing normal cooling capability to its associated drawer during the time period when segment 640a is open. In this manner, drawers may be accessed individually without impairing cooling of other drawers.

FIG. 6B further illustrates a segmented exhaust heat exchanger 650, having a partially open segment 650a and a closed, active segment 650b. Cover 634 pivots independently of all segments of heat exchanger 650. In this manner, the rear portion of a single drawer is accessible for tasks such as maintenance and repair, without impairing cooling of other drawers.

Several alternative embodiments are possible, within the spirit and scope of the present invention. For example, in the embodiment illustrated in FIGS. 6A and 6B, a single cover 630 is used with a segmented heat exchanger 640. An alternative embodiment is envisioned using a segmented cover, where each cover segment includes an integrated heat exchanger segment. In this manner, individual drawers are accessible while keeping the integrated cover and heat exchanger assemblies in place for other drawers. Such an embodiment maintains acoustic insulation and electromagnetic shielding for active drawers during a maintenance cycle for a single drawer. Also for example, louvers such as those illustrated in FIG. 3 may be combined with any embodiment, such as the embodiments illustrated in FIGS. 2 and 6. As a further example, a segmented heat exchanger similar to 640 may by provided such that it extends over only a portion of the active height of frame 610, where a portion of frame 610 includes low power devices for which ambient air provides sufficient cooling. As yet another example, a segmented heat exchanger 640 is envisioned having segments of varying heights, either to accommodate varying sized drawers, or to accommodate groups of drawers, or to accommodate combinations of single drawers, groups of drawers, stationary segments, etc.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A cooled electronics system comprising:
    a frame, said frame having:
        an air inlet and an air outlet, said inlet and outlet respectively enabling ingress and egress of external air;
        at least one electronics drawer;
        at least one air moving device, said air moving device being capable of causing external air to flow from said inlet, across said drawer, and to said outlet,
        an inlet fluid-to-air heat exchanger movably mounted to said frame at said air inlet, said inlet heat exchanger capable of cooling air entering said frame below ambient temperature when said heat exchanger is in a first position, said heat exchanger capable of being moved into at least a second position thereby providing access to said at least one electronics drawer.

2. The system of claim 1, comprising a plurality of said electronics drawers and a plurality of said air moving devices.

3. The system of claim 2, wherein said inlet heat exchanger includes a plurality of segments.

4. The system of claim 1, wherein said inlet heat exchanger is pivotally mounted on said frame.

5. The system of claim 4, wherein said inlet heat exchanger extends vertically substantially along the inlet of said frame.

6. The system of claim 4, wherein said inlet heat exchanger extends vertically along a portion of the inlet of said frame.

7. The system of claim 1, further comprising an inlet cover pivotally mounted to said frame, said inlet cover including an air-permeable portion.

8. The system of claim 7, further comprising louvers on said inlet cover.

9. The system of claim 8, wherein said louvers face downward.

10. The system of claim 7, wherein said inlet heat exchanger is integrated into said inlet cover.

11. The system of claim 1, further comprising an outlet fluid-to-air heat exchanger movably mounted to said frame at said air outlet, said outlet heat exchanger capable of cooling air exiting said frame when said heat exchanger is in a first position, said heat exchanger capable of being moved into at least a second position thereby providing access to said at least one electronics drawer.

12. The system of claim 11, wherein said outlet heat exchanger is pivotally mounted on said frame.

13. The system of claim 11, further comprising an outlet cover pivotally mounted to said frame, said outlet cover including an air-permeable portion.

14. The system of claim 13, further comprising louvers on said outlet cover.

15. The system of claim 14, wherein said louvers face upward.

16. The system of claim 13, wherein said outlet heat exchanger is integrated into said outlet cover.

17. A cooled electronics system comprising:
    a frame, said frame having an air inlet and an air outlet;
    a plurality of electronics drawers within said frame;
    a plurality of air moving devices within said frame, said air moving devices being capable of causing air to flow from said inlet, across said drawer, and to said outlet; and
    an inlet heat exchanger located at said air inlet, said inlet heat exchanger capable of cooling air entering said frame below ambient temperature, said inlet heat exchanger including a plurality of segments, wherein said segments are pivotally mounted on said frame, each segment capable of being pivoted independently of any others of said segments.

18. The system of claim 17, wherein each of said plurality of segments is associated with one drawer, thereby allowing removal of one of said drawers while cooling others of said drawers.

19. The system of claim 17, wherein at least one of said plurality of segments is associated with a plurality of said drawers.

20. The system of claim 17, further comprising an outlet heat exchanger located at said air outlet, said outlet heat exchanger capable of cooling air exiting said frame, said outlet heat exchanger including a plurality of segments, wherein said outlet heat exchanger segments are pivotally mounted on said frame, each outlet heat exchanger segment capable of being pivoted independently of any others of said outlet heat exchanger segments.

21. A method of cooling an electronics system, the method comprising:
    causing external air to enter said electronics system;
    providing a first heat exchanger movably connected to said electronics system to cool incoming air to a temperature below ambient temperature;
    causing air exiting the first heat exchanger to flow through and then exit the electronics system.

22. The method of claim 21, further comprising:
    providing a second heat exchanger movably connected to said electronics system;
    causing air exiting the electronics system to flow through the second heat exchanger;
    exhausting air from the second heat exchanger at near ambient temperature.

23. The method of claim 22, wherein exhausted air is at a temperature no more than 10° C. higher than ambient temperature.

24. A cooled electronics system comprising:

a frame, said frame having:
- an air inlet and an air outlet, said inlet and outlet respectively enabling ingress and egress of external air;
- a plurality of electronics drawers;
- a plurality of air moving devices, said air moving devices being capable of causing external air to flow from said inlet, across said drawers, and to said outlet;

an inlet cover pivotally mounted to said frame at said air inlet, said inlet cover including an air-permeable portion, said inlet cover having louvers to direct incoming airflow;

an inlet fluid-to-air heat exchanger integrated into said inlet cover, said inlet heat exchanger capable of cooling air entering said frame below ambient temperature when in a first position, said inlet heat exchanger further capable of pivoting as a single unit along with said inlet cover to a second position thereby providing access to said plurality of electronics drawers;

wherein said inlet cover, said louvers, and said inlet heat exchanger provide acoustic insulation and electromagnetic shielding.

25. The system of claim 24, further comprising:

an outlet cover pivotally mounted to said frame at said air outlet, said outlet cover including an air-permeable portion, said outlet cover having louvers to direct outgoing airflow;

an outlet fluid-to-air heat exchanger integrated into said outlet cover, said outlet heat exchanger capable of cooling air exiting said frame when in a first position, said outlet heat exchanger further capable of pivoting as a single unit along with said outlet cover to a second position thereby providing access to said plurality of electronics drawers;

wherein said outlet cover, said louvers, and said outlet heat exchanger provide acoustic insulation and electromagnetic shielding.

* * * * *